United States Patent
Kim et al.

(10) Patent No.: US 9,804,676 B2
(45) Date of Patent: Oct. 31, 2017

(54) DISPLAY PANEL INCLUDING PIEZOELECTRIC DEVICE AND METHOD FOR COMPENSATING FOR PROPERTIES OF PIEZOELECTRIC DEVICE

(71) Applicant: Samsung Display Co., Ltd., Yongin, Gyeonggi-Do (KR)

(72) Inventors: Beom Shik Kim, Yongin-si (KR); Jong Seo Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/749,203

(22) Filed: Jun. 24, 2015

(65) Prior Publication Data
US 2016/0209922 A1 Jul. 21, 2016

(30) Foreign Application Priority Data
Jan. 15, 2015 (KR) ........................ 10-2015-0007622

(51) Int. Cl.
G06F 3/01 (2006.01)
G06F 3/041 (2006.01)
H01L 41/04 (2006.01)

(52) U.S. Cl.
CPC ............ G06F 3/016 (2013.01); G06F 3/0412 (2013.01); H01L 41/042 (2013.01)

(58) Field of Classification Search
None
See application file for complete search history.

(56) References Cited

U.S. PATENT DOCUMENTS

| 4,577,510 A | * | 3/1986 | Bur | ........................ G01L 9/0001 374/143 |
| 6,148,671 A | * | 11/2000 | Nakamizo | ........... G01P 15/0907 73/514.34 |
| 2015/0160727 A1 | * | 6/2015 | Shinozaki | ............. G06F 3/0488 340/407.2 |

FOREIGN PATENT DOCUMENTS

JP 2012-049789 3/2012
KR 10-2011-0138629 A 12/2011

* cited by examiner

*Primary Examiner* — Kenneth B Lee, Jr.
(74) *Attorney, Agent, or Firm* — Innovation Counsel LLP (57) ABSTRACT

There is provided a display panel including a piezoelectric device and a method for compensating properties of a piezoelectric device. According to the an exemplary embodiment of the present disclosure, the display panel includes: a panel; and a piezoelectric device coupled with the panel, wherein the piezoelectric device includes: a plurality of piezoelectric elements disposed at different positions of the panel and each configured to generate vibrations according to a driving signal; a driver configured to supply the driving signal to the plurality of piezoelectric elements; a plurality of acceleration sensors configured to detect acceleration information of vibrations in different regions of the panel; and a compensator configured to control the driving signal to compensate for property deviations of the plurality of piezoelectric elements, based on the acceleration information.

10 Claims, 8 Drawing Sheets

DISPLAY PANEL INCLUDING PIEZOELECTRIC DEVICE AND METHOD FOR COMPENSATING FOR PROPERTIES OF PIEZOELECTRIC DEVICE

CROSS-REFERENCE TO RELATED APPLICATION

This application claims priority to and the benefit of Korean Patent Application No. 10-2015-0007622 filed in the Korean Intellectual Property Office on Jan. 15, 2015, the entire contents of which are incorporated herein by reference.

BACKGROUND (a) Field

The present disclosure relates to a display panel including a piezoelectric device and a method for compensating properties of a piezoelectric device.

(b) Description of the Related Art

Recently, electronics having an embedded touch input device and a haptic feedback device for providing a tactile feedback for a user touch have been widely used.

When the user touch is sensed by the touch input device, the haptic feedback device provides a vibration output as a tactile feedback for the sensed user touch to the user. In the haptic feedback device, a piezoelectric element has been mainly used as an actuator to generating the vibration output.

However, because characteristics of the piezoelectric element, such as its piezoelectric constant, change according to temperature, a haptic feedback device that uses a piezoelectric element as the actuator may not provide uniform feedback under varying temperature conditions. That is, the haptic feedback device changes in performance in response to the temperature of the piezoelectric element, which acts as one of the factors that reduce the reliability of the haptic feedback device.

Further, even though the piezoelectric elements used in a haptic feedback device are manufactured by the same manufacturing process, a deviation in their performance may occur. Thus, when the haptic feedback device is applied to a large screen, the deviation in performance of the piezoelectric elements may reduce the reliability of the haptic feedback device due to non-uniform feedback.

The above information disclosed in this Background section is only for enhancement of understanding of the background of the disclosure, and therefore, it may contain information that does not form the prior art that is already known in this country to a person of ordinary skill in the art.

SUMMARY

The present disclosure provides a piezoelectric device and a method for compensating properties of a piezoelectric device, which have advantages of providing uniform haptic feedback by compensating for a change in physical properties and a deviation in performance in response to a temperature of a piezoelectric element.

An exemplary embodiment of the present disclosure provides a display panel, including: a panel; and a piezoelectric device coupled with the panel, wherein the piezoelectric device includes: a plurality of piezoelectric elements disposed at different positions of the panel and configured to generate vibrations according to a driving signal; a driver configured to supply the driving signal to the plurality of piezoelectric elements; a plurality of acceleration sensors configured to detect acceleration information of vibrations in different regions of the panel; and a compensator configured to control the driving signal to compensate for the property deviations of plurality of piezoelectric elements, based on the acceleration information.

Another embodiment of the present disclosure provides a method for compensating for properties of a piezoelectric device including a plurality of piezoelectric elements, including: applying the same driving signal to the plurality of piezoelectric elements; detecting, by a plurality of acceleration sensors spaced apart from each other, acceleration information due to an output of the plurality of piezoelectric elements; calculating property deviations of the plurality of piezoelectric elements based on the acceleration information; and controlling driving signals output to the plurality of piezoelectric elements to compensate for the property deviations.

According to an exemplary embodiment of the present disclosure, it is possible to provide uniform haptic feedback by compensating for the change in physical properties and the deviation in performance of the piezoelectric element in response to the temperature.

DETAILED DESCRIPTION OF THE EMBODIMENTS

In the following detailed description, only certain exemplary embodiments of the present disclosure have been shown and described for the purpose of illustration. As those skilled in the art would realize, the described embodiments may be modified in various different ways, all without departing from the spirit or scope of the present disclosure. Accordingly, the drawings and description are illustrative in nature and not restrictive. Like reference numerals designate like elements throughout the specification.

According to an exemplary embodiment of the present disclosure, it is possible to provide uniform tactile feedback to a user irrespective of a change in temperature by controlling a driving signal applied to a piezoelectric element to compensate for a change in physical properties of the piezoelectric element in response to the change in temperature.

Further, according to an exemplary embodiment of the present disclosure, it is possible to provide uniform tactile feedback to a user irrespective of a touched position by detecting a deviation in performance of the piezoelectric elements using an acceleration sensor and controlling the driving signal to each piezoelectric element to compensate for the deviation in performance of the piezoelectric elements.

Hereinafter, a display panel including a piezoelectric device and a method for compensating for changes in the properties of the piezoelectric device according to an exemplary embodiment of the present disclosure is described with reference to FIGS. 1 to 4.

Figure 1:
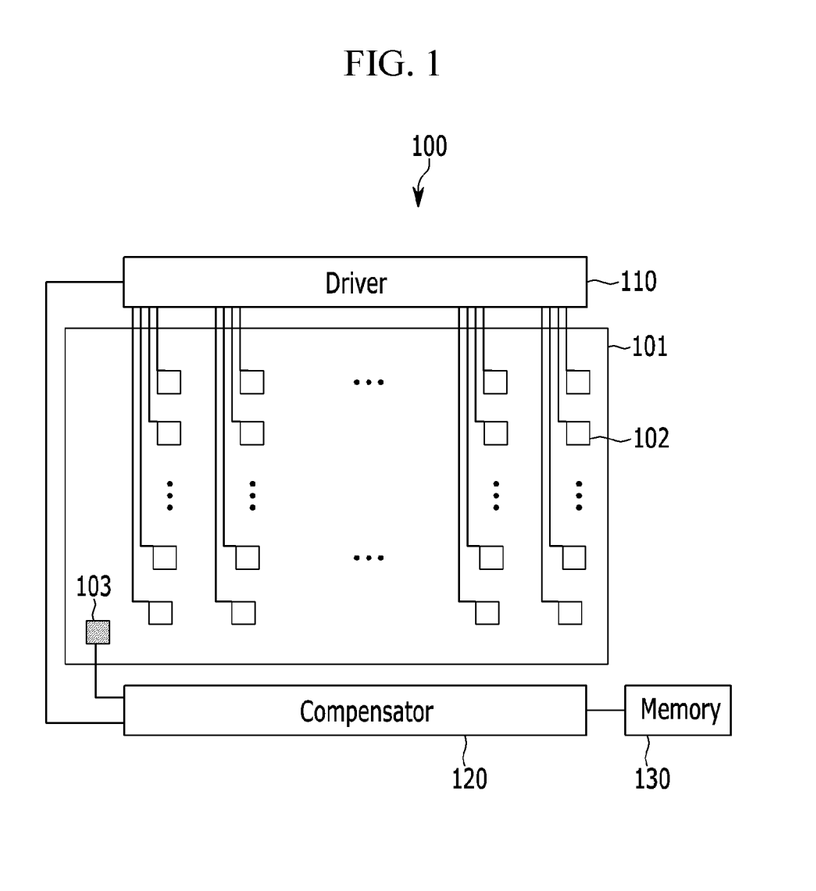
FIG. 1 is a block diagram schematically illustrating a display panel including a piezoelectric device according to an exemplary embodiment of the present disclosure.
Figure 2:
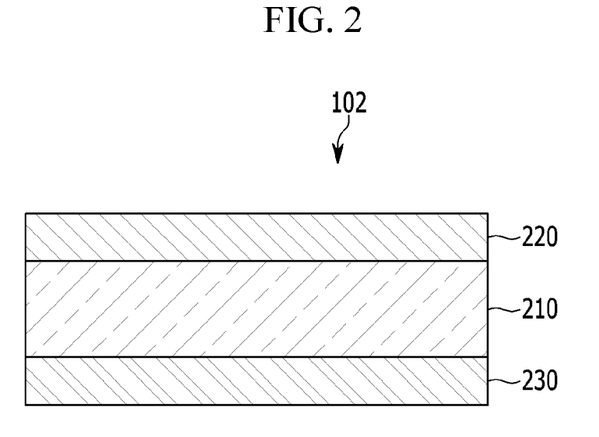
FIG. 2 is a cross-sectional view schematically illustrating an exemplary piezoelectric element.
Figure 3:
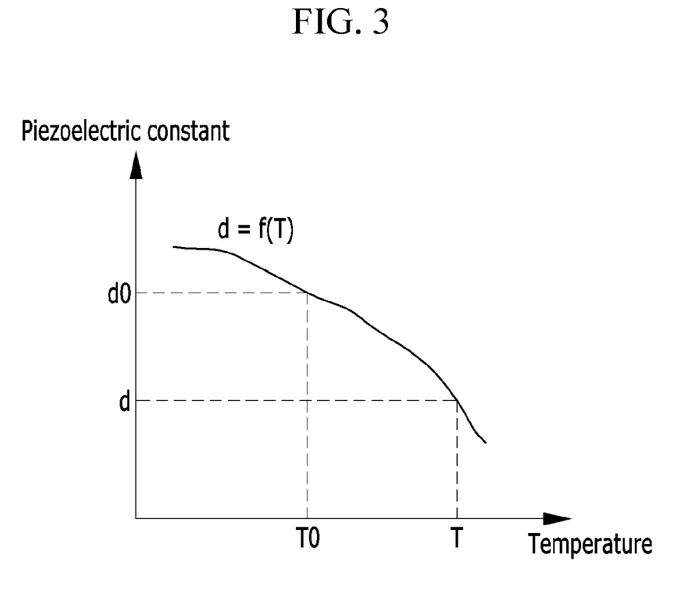
FIG. 3 is a diagram for describing temperature dependency of an exemplary piezoelectric element.

FIG. 1 is a block diagram schematically illustrating a display panel according to an exemplary embodiment of the present disclosure. FIG. 2 is a cross-sectional view schematically illustrating an exemplary piezoelectric element. FIG. 3 is a diagram for describing temperature dependency of an exemplary piezoelectric element.

Referring to FIG. 1, a display panel 100 according to an exemplary embodiment of the present disclosure includes a panel 101 in which a plurality of pixel units (not illustrated) are disposed and a piezoelectric device coupled with the panel 101. The piezoelectric device may include a plurality of piezoelectric elements 102 that are disposed on the panel 101 and spaced apart from each other, a temperature sensor 103, a driver 110, a compensator 120, and a memory 130. The components illustrated in FIG. 1 are not exhaustive, and therefore, in some exemplary embodiments, the piezoelectric device may also be implemented to include a larger or smaller number of components than that.

The plurality of piezoelectric elements 102 are disposed on the panel 101 and spaced apart from each other at a predetermined interval.

The piezoelectric element 102 generates vibrations by inducing mechanical deformation of a piezoelectric film (see reference numeral 210 of FIG. 2).

Referring to FIG. 2, the piezoelectric element 102 may include a piezoelectric film 210 and first and second electrodes 220 and 230 that are disposed on two opposite surfaces of the piezoelectric film 210.

Generally, a piezoelectric effect refers to an interaction between the mechanical and electrical states of a material having a crystal structure. That is, when a mechanical change (compression or tension) is applied to the corresponding material, an electrical signal is generated. Vice versa, when an electrical signal is applied to the material, a mechanical change is generated.

The piezoelectric film 210 is a member for generating the piezoelectric effect and is formed by processing a piezoelectric polymer in a film form.

The first and second electrodes 220 and 230 are connected to the driver (see reference numeral 110 of FIG. 1) and are applied with electrical driving signals (driving voltage) from the driver 110. The electrical driving signal received from the driver 110 is transferred to the piezoelectric film 210, and thus, the piezoelectric film 210 is subjected to a mechanical change. The degree of the mechanical change of the piezoelectric film 210 corresponds to the magnitude of the driving voltage applied to the first and second electrodes 220 and 230. That is, the larger the driving voltage applied to the piezoelectric film 210, the larger the mechanical variation of the piezoelectric film 210. As a result, the output (vibration) of the piezoelectric element 102 is increased correspondingly.

Referring again to FIG. 1, the driver 110 supplies the electrical driving signals (driving voltage) to each piezoelectric element 102 to vibrate the piezoelectric elements 102.

The temperature sensor 103 is disposed on the panel 101 to detect temperature information around the piezoelectric element 102.

The temperature sensor 103 is connected to the compensator 120, and the temperature information detected by the temperature sensor 103 is transferred to the compensator 120.

The memory 130 stores temperature property information including characteristics of a change in physical properties in response to a change in the temperature of the piezoelectric element 102.

Hereinafter, the change in physical properties in response to the temperature of the piezoelectric element 102 is described in detail with reference to FIG. 3.

An output F of the piezoelectric element 102 may be represented by the following Equation 1.

$$F = d \times E \times S \times Y \quad \text{Equation 1}$$

In the above Equation 1, d represents a piezoelectric constant of the piezoelectric film (see reference numeral 210 of FIG. 2), E represents an electric field, S represents a size of the piezoelectric film 210, and Y represents Young's modulus of the piezoelectric film 210.

In the equation 1, the electric field E may be represented by the following Equation 2.

$$E = V/m \quad \text{Equation 2}$$

In the above Equation 2, V supplied to the piezoelectric element 102 represents the driving signal (driving voltage) and m represents a mass.

Based on the above Equations 1 and 2, the output F of the piezoelectric element 102 may be substantially represented by the following Equation 3.

$$F \propto d \times V \times S \times Y \quad \text{Equation 3}$$

Referring to the above Equations 1 to 3, if it is assumed that the size S of the piezoelectric film 210 is equal to the Young's modulus of the piezoelectric film 210, it may be appreciated that the output F of the piezoelectric element 102 may be changed in response to a piezoelectric constant d and a driving signal V.

As illustrated in FIG. 3, the piezoelectric constant d of the piezoelectric element 102 is changed in response to the temperature T. That is, the piezoelectric constant d of the piezoelectric element 102 is reduced as the temperature is increased. This means that, according to Equation 3, the output F of the piezoelectric element 102 is also reduced as the temperature is increased. However, the decrease in d due to increasing temperature may be compensated by increasing V, according to an exemplary embodiment of the present system and method, so that the output F is maintained at a constant level.

For example, consider maintaining the output F of the piezoelectric element 102 at a reference output $F \propto d_0 \times V_0 \times S \times Y$, where $d_0$ is the piezoelectric constant of the piezoelectric element 102 at a reference temperature $T_0$ and $V_0$ is a reference driving signal supplied to the piezoelectric element 102. Generally, the size S of the piezoelectric film 210 and the Young's modulus Y are negligibly influenced, if any, by a temperature change and therefore assumed to be the same irrespective of the temperature in this case.

To make the output F of the piezoelectric element 102 at any temperature T equal to the output of the piezoelectric element 102 at the reference temperature T0, a relationship Equation $F_0=F$ is established. That is, a relationship Equation of $(d_0 \times V_0 \times S \times Y)=(d \times V \times S \times Y)$ is established, and a relationship Equation of $(d_0 \times V_0)=(d \times V)$ may be derived therefrom.

Therefore, to make the output F of the piezoelectric element 102 at any temperature T equal to the output of the piezoelectric element 102 at the reference temperature $T_0$, there is a need to change the driving signal V to compensate for the change in the piezoelectric constant.

The driving signal V for compensating for the change in physical properties (change in piezoelectric constant) at any temperature T may be represented by the following Equation 4.

$$V=(d_0 \times V_0)/d=(d_0 \times V_0)/f(T) \quad \text{Equation 4}$$

In the above equation 4, the piezoelectric constant $d_0$ and the driving signal $V_0$ at the reference temperature $T_0$ are constant. Further, as illustrated in FIG. 3, the piezoelectric constant d is derived from a property function f(T) that represents a relationship between the temperature T of the piezoelectric element 102 and the piezoelectric constant d.

In some exemplary embodiments of the present disclosure, the property function f(T) may be stored in the memory 130 as temperature property information. In this case, the piezoelectric constant $d_0$ and the reference driving signal $V_0$ of the piezoelectric element 102 at the reference temperature $T_0$ are used as calculation parameters at the time of calculating a temperature-compensated driving signal by the compensator 120.

According to another exemplary embodiment of the present disclosure, the temperature property information stored in the memory 130 may further include the piezoelectric constant $d_0$ and the reference driving signal $V_0$ of the piezoelectric element 102 at the reference temperature $T_0$, in addition to the property function f(T).

The property function f(T) may be stored in the memory 130 as a lookup table form in which the piezoelectric constants each correspond to a temperature.

Referring again to FIG. 1, the compensator 120 is connected to the temperature sensor 103 and receives the temperature information from the temperature sensor 103. Further, the compensator 120 reads the temperature property information corresponding to the temperature information from the memory 130, calculates the driving signal for compensating for the change in physical properties (change in piezoelectric constant) of the piezoelectric element 102 in response to the change in temperature based on the read temperature property information, and controls the driver 110 to output the corresponding driving signal.

That is, the compensator 120 acquires the piezoelectric constant d from the lookup table stored in the memory 130 based on the temperature information received from the temperature sensor 103. Further, the temperature-compensated driving signal V is calculated by substituting the piezoelectric constant $d_0$ and the reference driving signal $V_0$ of the piezoelectric element 102 at the reference temperature and the acquired piezoelectric constant d into Equation 4. Further, the change in physical properties in response to the temperature of the piezoelectric element 102 is compensated by controlling the driver 110 to output the calculated temperature compensation driving signal V.

Referring to FIG. 3, the piezoelectric constant d is reduced as temperature is increased and is increased as temperature is reduced. Therefore, when the temperature is higher than the reference temperature $T_0$, the compensator 120 increases the magnitude of the driving signal V, thereby compensating for the change in the piezoelectric constant d in response to the increase in temperature. On the other hand, when the temperature is lower than the reference temperature $T_0$, the compensator 120 decreases the magnitude of the driving signal V, thereby compensating for the change in the piezoelectric constant d in response to the decrease in temperature.

According to some exemplary embodiments of the present disclosure, the driver 110 and the compensator 120 may each be implemented using different application specific integrated circuits (ASICs). According to another exemplary embodiment of the present disclosure, a single ASIC may also be used to implement all functions of the driver 110 and the compensator 120. According to another exemplary embodiment of the present disclosure, a field programmable gate array (FPGA) may be programmed to perform the functions of the driver 110 and the compensator 120. According to another exemplary embodiment of the present disclosure, a general-purpose processor, such as an advanced RISC machine (ARM) processor, may be programmed to perform each function of the driver 110 and the compensator 120.

Figure 4:
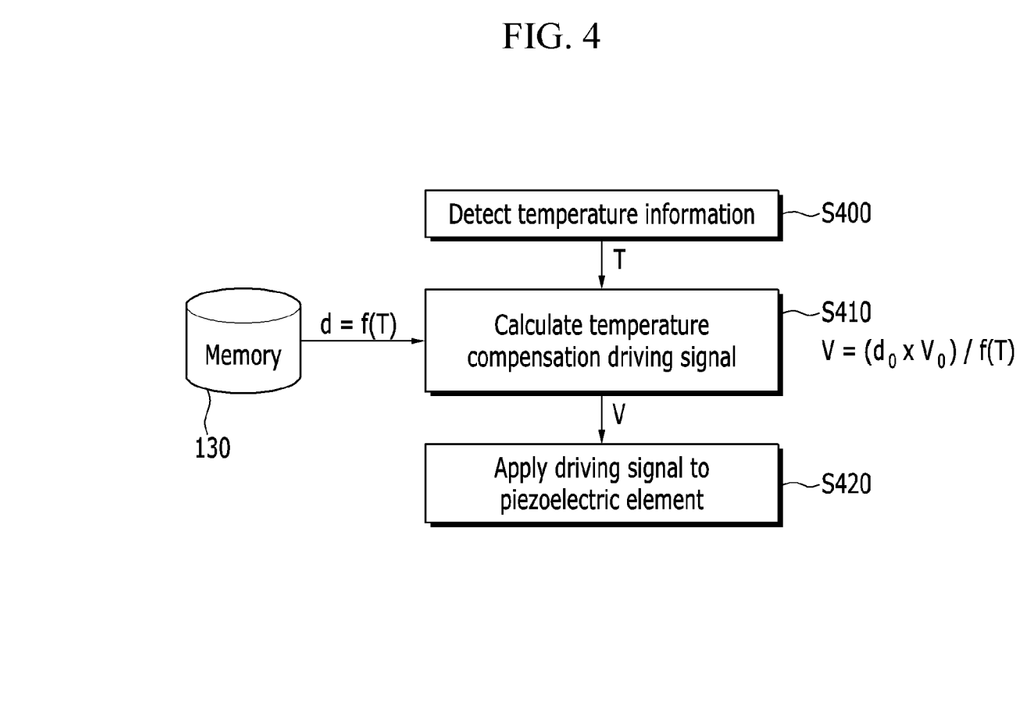
FIG. 4 is a flow chart illustrating a method for compensating for properties of the piezoelectric device according to an exemplary embodiment of the present disclosure.

FIG. 4 is a flow chart illustrating a method for compensating for properties of the piezoelectric device according to an exemplary embodiment of the present disclosure.

Referring to FIG. 4, according to an exemplary embodiment of the present disclosure, the piezoelectric device detects the temperature information T around the piezoelectric device 102 using the temperature sensor 103 (S400).

When the temperature information T is detected, the piezoelectric device reads the temperature property information (i.e., the piezoelectric constant d) corresponding to the temperature information T from the memory 130 through the compensator 120. Further, the driving signal V depending on the temperature information T is calculated by substituting the temperature property information read through the compensator 120 into the relationship $V=(d0 \times V0)/d$ of the above Equation 4 (S410).

After the driving signal V is calculated, the piezoelectric device controls the driver 110 to output the corresponding driving signal V, thereby compensating for changes in physical properties that depend on the temperature of the piezoelectric element 102 (S420).

According to an exemplary embodiment of the present disclosure, the piezoelectric device senses the temperature around the piezoelectric element 102 to control the driving signal to compensate for the change in physical properties in response to the change in temperature and thus is insensitive to the change in temperature, thereby generating a uniform output irrespective of the change in temperature.

As described above, the piezoelectric device according to an exemplary embodiment of the present disclosure is integrated or coupled with the display panel of the display device, and as a result, may be operated as the haptic feedback device providing haptic feedback in the display device.

Hereinafter, a display panel including a piezoelectric device and a method for compensating for properties of the piezoelectric device according to another exemplary embodiment of the present disclosure is described with reference to FIGS. 5 and 6.

Figure 5:
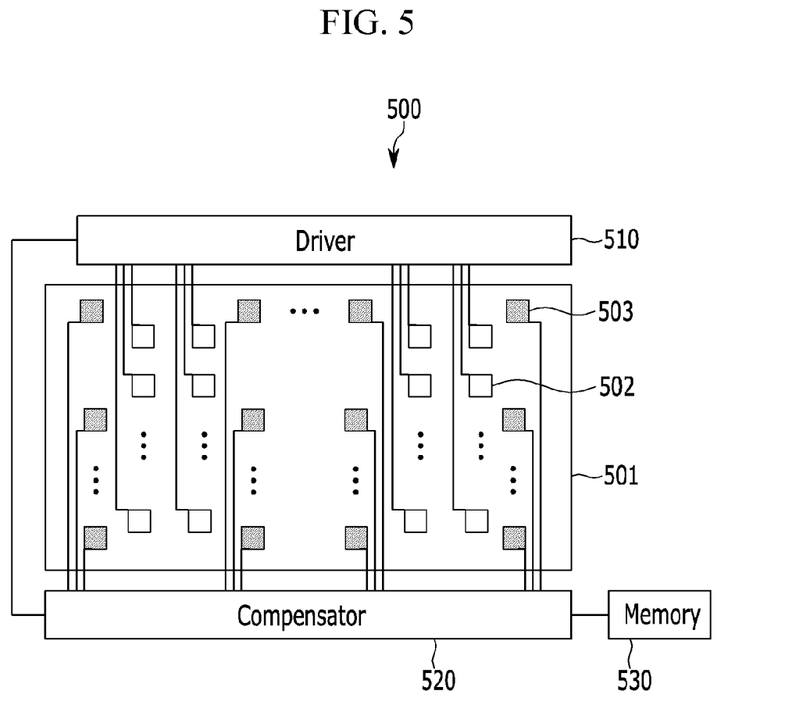
FIG. 5 is a block diagram schematically illustrating a display panel including a piezoelectric device according to another exemplary embodiment of the present disclosure.

FIG. 5 is a block diagram schematically illustrating a display panel including a piezoelectric device according to another exemplary embodiment of the present disclosure.

Referring to FIG. 5, a display panel 500 according to another exemplary embodiment of the present disclosure includes a panel 501 and a piezoelectric device coupled with the panel 501. Further, the piezoelectric device may include a plurality of piezoelectric elements 502 that are disposed on the panel 502 and spaced apart from each other, a plurality of temperature sensors 503, a driver 510, a compensator 520, and a memory 530.

Hereinafter, a detailed description of components that are the same as or similar to those of the piezoelectric device described with reference to FIG. 1 is omitted.

The plurality of piezoelectric elements 502 are disposed on the panel 501 and spaced apart from each other at a predetermined interval.

The piezoelectric element 502 generates vibrations by inducing mechanical deformation of a piezoelectric film (see reference numeral 210 of FIG. 2). The piezoelectric element 502 may include the piezoelectric film (see reference numeral 210 of FIG. 2) and the first and second electrodes (see reference numerals 220 and 230 of FIG. 2) that are disposed on two opposite surfaces of the piezoelectric film.

As the driving signals supplied from the driver 510 through the first and second electrodes 220 and 230 are transferred to the piezoelectric film 210, the piezoelectric element 502 generates vibrations due to the mechanical change to the piezoelectric film 210.

The driver 510 supplies the electrical driving signals (driving voltage) to each piezoelectric element 502 to vibrate the piezoelectric elements 502.

The plurality of temperature sensors 503 are disposed on the panel 501 and spaced apart from each other at a predetermined interval to detect the surrounding temperature information.

Each temperature sensor 503 is connected to the compensator 520, and the temperature information detected by the temperature sensor 503 is transferred to the compensator 520.

As described in some exemplary embodiments of the present disclosure, the memory 530 stores the temperature property information including characteristics of a change in physical properties of the piezoelectric element 502 in response to the temperature.

In some exemplary embodiments of the present disclosure, the property function f(T) may be stored in the memory 530 as temperature property information. According to another exemplary embodiment of the present disclosure, the temperature property information stored in the memory 530 may further include the piezoelectric constant $d_0$ and the reference driving signal $V_0$ of the piezoelectric element 502 at the reference temperature $T_0$, in addition to the property function f(T).

The property function f(T) may be stored in the memory 530 in a lookup form in which the piezoelectric constants each correspond to a temperature.

The plurality of piezoelectric elements 502 that are disposed on the panel 501 is divided into a plurality of groups that correspond one-to-one to the plurality of temperature sensors 503. Each group of the piezoelectric elements may include at least one piezoelectric element 502.

The compensator 520 reads the temperature property information corresponding to the temperature information from the memory 503 based on the temperature information detected by the temperature sensor 503. Further, the temperature compensation driving signals for each group of piezoelectric elements are calculated based on the read temperature property information.

That is, the compensator 520 reads the piezoelectric constant d corresponding to the temperature information detected by each temperature sensor 503 from the memory 530. Further, the temperature-compensated driving signals V for each group of piezoelectric elements are calculated by substituting the piezoelectric constant $d_0$ and the reference driving signal $V_0$ at the reference temperature $T_0$ and the piezoelectric constant d corresponding to the temperature information in each temperature sensor 503 into Equation 4.

After the temperature compensation driving signals V for each group of piezoelectric elements are calculated, the compensator 520 controls the driver 510 to output the temperature compensation driving signals V corresponding to each group of piezoelectric elements. The compensator 520 controls the driver 510 to output the temperature compensation driving signal V corresponding to the corresponding group to the piezoelectric elements 502 included in the same group.

Figure 6:
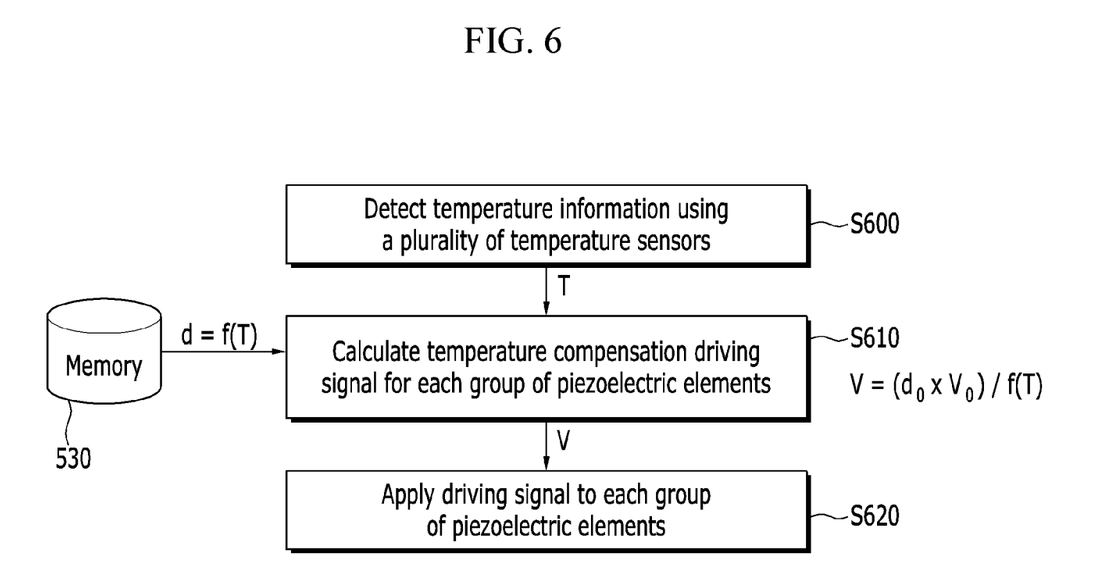
FIG. 6 is a flow chart illustrating a method for compensating for properties of a piezoelectric device according to another exemplary embodiment of the present disclosure.

FIG. 6 is a flow chart illustrating a method for compensating for properties of a piezoelectric device according to another exemplary embodiment of the present disclosure.

Referring to FIG. 6, according to another exemplary embodiment of the present disclosure, the piezoelectric device detects the temperature information T using the plurality of temperature sensors 503 that are disposed to be spaced apart from each other at a predetermined interval (S600).

In S600, the temperature information detected by each temperature sensor 503 corresponds to different groups of piezoelectric elements depending on the position of the temperature sensors 503. The plurality of piezoelectric elements 502 that are disposed on the panel 501 are divided into groups of piezoelectric elements including at least one piezoelectric element 502 depending on the disposition position of the temperature sensors 503.

When the temperature information T is detected by each temperature sensor 503, the piezoelectric device reads the temperature property information (i.e., the piezoelectric constant d) corresponding to the temperature information T from the memory 530 through the compensator 520. Further, the piezoelectric device calculates the temperature compensation driving signal V based on the temperature information T for the corresponding groups of piezoelectric elements by substituting the temperature property information read from the memory 530 through the compensator 520 into the relationship Equation V=(d0×V0)/d) of the above Equation 4 (S610).

After the driving signal V is calculated, the piezoelectric device controls the driver 510 to output the temperature compensation driving signals V corresponding to each group of piezoelectric elements (S620).

As described above, the piezoelectric device according to another exemplary embodiment of the present disclosure is integrated or coupled with the display panel of the display device, and as a result, may be operated as the haptic feedback device providing haptic feedback in the display device. In particular, if the piezoelectric device is operated as the haptic feedback device in a large screen display device, the piezoelectric device may be insensitive to the change in temperature and may provide uniform haptic feedback irrespective of the deviation in temperature that occurs in the large display panel, thereby improving the reliability of the haptic feedback device.

Hereinafter, a display panel including a piezoelectric device and a method for compensating for properties of the piezoelectric device according to still another exemplary embodiment of the present disclosure is described with reference to FIGS. 7 and 8.

Figure 7:
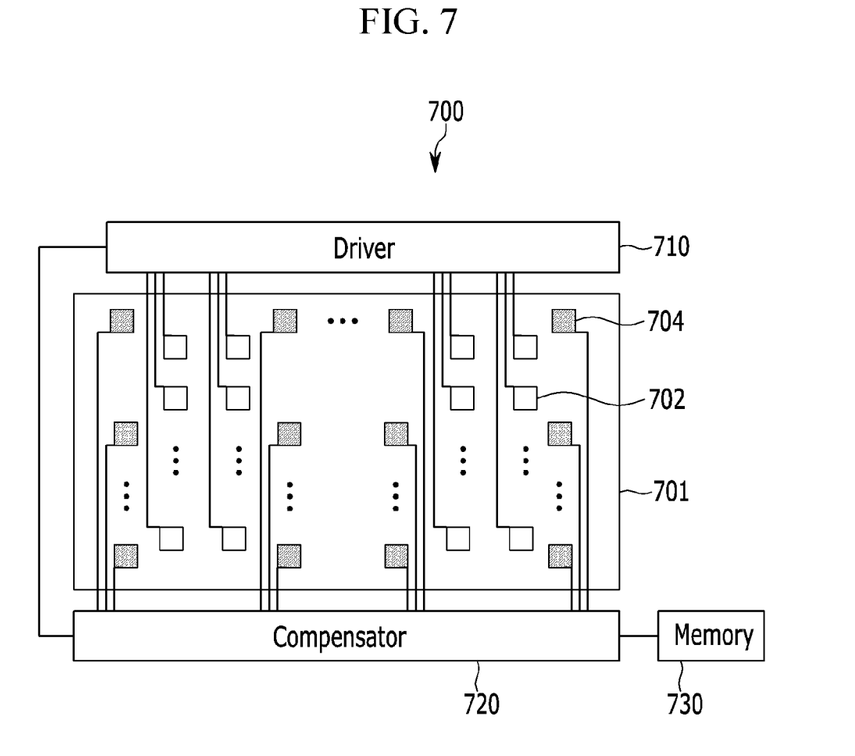
FIG. 7 is a block diagram schematically illustrating a display panel including a piezoelectric device according to still another exemplary embodiment of the present disclosure.

FIG. 7 is a block diagram schematically illustrating a display panel according to still another exemplary embodiment of the present disclosure.

Referring to FIG. 7, a display panel 700 according to still exemplary embodiment of the present disclosure includes a panel 701 in which a plurality of pixel units (not illustrated) are disposed and a piezoelectric device coupled with the panel 701. Further, the piezoelectric device may include a plurality of piezoelectric elements 702 that are disposed on the panel 702 and spaced apart from each other, a plurality of acceleration sensors 704, a driver 710, a compensator 720, and a memory 730.

Hereinafter, a detailed description of components that are the same as or similar to those of the piezoelectric device described with reference to FIG. 1 is omitted.

The plurality of piezoelectric elements 702 are disposed on the panel 701 and spaced apart from each other at a predetermined interval.

The piezoelectric element 702 generates vibrations by inducing mechanical deformation of a piezoelectric film (see reference numeral 210 of FIG. 2). The piezoelectric element 702 may include the piezoelectric film (see reference numeral 210 of FIG. 2) and the first and second electrodes (see reference numerals 220 and 230 of FIG. 2) that are disposed on two opposite surfaces of the piezoelectric film.

As the driving signals supplied from the driver 710 through the first and second electrodes 220 and 230 are transferred to the piezoelectric film 210, the piezoelectric element 702 generates vibrations due to the mechanical change to the piezoelectric film 210.

The driver 710 supplies the electrical driving signals (driving voltage) to each piezoelectric element 702 to vibrate the piezoelectric elements 702.

The plurality of acceleration sensors 704 are disposed on the panel 710 and spaced apart from each other at a predetermined interval and detect acceleration information in different regions in the panel 701. Each acceleration sensor 704 detects acceleration information based an output of the piezoelectric element 702, that is, vibrations occurring due to the mechanical deformation of the piezoelectric element 702.

The acceleration information detected by the acceleration sensor 704 is transferred to the compensator 720.

The compensator 720 calculates property deviations (output deviation) of the plurality of piezoelectric elements 702 based on the deviation in the acceleration information detected by each acceleration sensor 704.

The relationship between the output F of the piezoelectric element 702 and acceleration a detected by the acceleration sensor 704 may be approximately represented by the following Equation 5.

$$F = m \times a \qquad \text{Equation 5}$$

In the above Equation 5, m represents a mass and a represents acceleration.

It may be appreciated from the above Equation 5 that as the output F of the piezoelectric element 702 is increased, the acceleration detected by the acceleration sensor 704 is increased.

Therefore, when the output F of each of the piezoelectric elements 702 is different due to property deviations in the piezoelectric elements 702, it is possible to calculate the property deviations of the piezoelectric elements 702 based on the deviations in the acceleration information a detected by the acceleration sensors 704.

The compensator 720 detects the acceleration information using the plurality of acceleration sensors 704 while the same driving signal is applied to the plurality of piezoelectric elements 702. Since the same driving signal is applied to all the piezoelectric elements 702, each of the piezoelectric elements 702 should ideally generate the same output.

However, when the output properties among the piezoelectric elements 702 are different, even though the same driving signal is applied to all the piezoelectric elements, the output of each piezoelectric element 702 is different. The difference in outputs may be represented as the deviations in the acceleration information detected by the plurality of acceleration sensors 704.

The compensator 720 calculates the deviations of the acceleration information detected by the plurality of acceleration sensors 704 while the same driving signal is applied to the plurality of piezoelectric elements 702. After the acceleration information is detected by the plurality of acceleration sensors 704, the compensator 720 averages the detected acceleration information to determine reference acceleration information. Alternatively, the compensator 720 may use predetermined acceleration information as reference acceleration information. Further, the deviations of the acceleration information are calculated based on a difference value between the reference acceleration information and each of the acceleration information.

The compensator 720 estimates the property deviations of the piezoelectric elements 702 based on the deviations of the acceleration information. Each of the acceleration information is proportional to the output of at least one corresponding piezoelectric element 702, and therefore, the compensator 720 may estimate the property deviations of the piezoelectric elements 702 based on the deviations of the acceleration information.

As the property deviations of the piezoelectric elements 702 are calculated, the compensator 720 controls the driving signals output through the driver to compensate for the property deviations of the piezoelectric elements 702. That is, when the property deviations of the piezoelectric elements 702 are calculated, the compensator 720 calculates a compensation value for compensating for each property deviation and controls the size of each driving signal output from the driver 710 based on the calculated compensation value, thereby compensating for the output deviations that result from the property deviations of the piezoelectric elements 702.

According to some exemplary embodiments of the present disclosure, the number of piezoelectric elements that are disposed on the panel 701 may be equal to the number of acceleration sensors 704. In this case, the plurality of acceleration sensors 704 corresponds to the plurality of piezoelectric elements 702 one-to-one. According to another exemplary embodiment, the number of acceleration sensors 704 disposed on the panel 701 may be relatively smaller than the number of piezoelectric elements 702. In this case, each acceleration sensor 704 may correspond to more than one piezoelectric element 702.

When the acceleration sensor 704 corresponds to the piezoelectric element 702 one-to-one, the compensator 720 may estimate the property deviation of each of the piezoelectric elements 702 based on the deviation in the acceleration information detected by each corresponding acceleration sensor 704. Further, the compensation value for compensating for the property deviations of each piezoelectric element 702 is calculated based on the estimated property deviation of the piezoelectric elements 702.

When each acceleration sensor 704 corresponds to more than one piezoelectric element 702, the plurality of piezoelectric elements 702 may be divided into a plurality of groups. In this case, the compensator 720 estimates the property deviations of each group of piezoelectric elements based on the deviation in the acceleration information detected by each corresponding acceleration sensor 702. Further, the compensator 720 may calculate the compensation value for compensating for the property deviations for each group of piezoelectric elements based on the property deviations of the groups of piezoelectric elements. Therefore, the same compensation value is applied to at least one piezoelectric element 702 included in each group of piezoelectric elements.

When each acceleration sensor 704 corresponds to more than one piezoelectric element 702, the compensator 720 extrapolates/interpolates the acceleration information detected by the plurality of acceleration sensors 704, thereby estimating the acceleration information corresponding to each piezoelectric element 702. In this case, the compensator 720 estimates the property deviation of the piezoelectric elements 702 based on the deviation of the acceleration information estimated for each piezoelectric element 702 and calculates the compensation value for compensating for the property deviation of each piezoelectric element 702 based on the estimated property deviation.

Figure 8:
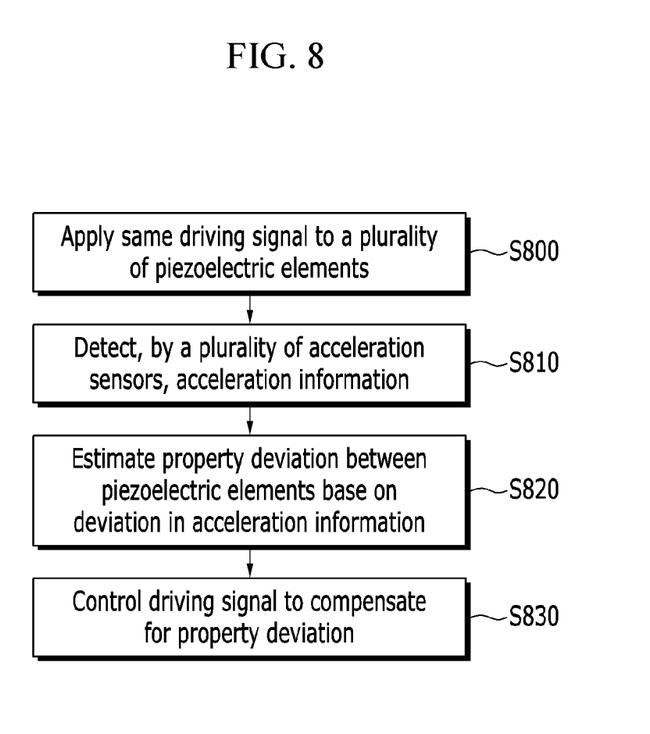
FIG. 8 is a flow chart illustrating a method for compensating for properties of a piezoelectric device according to still another exemplary embodiment of the present disclosure.

FIG. 8 is a flow chart illustrating a method for compensating for properties of a piezoelectric device according to still another exemplary embodiment of the present disclosure.

Referring to FIG. 8, according to still another exemplary embodiment of the present disclosure, the piezoelectric device applies the same driving signal to the plurality of piezoelectric elements 702 through the driver 710 (S800). The acceleration information is detected by the plurality of acceleration sensors 704 while the same driving signal is applied to the plurality of piezoelectric elements 702 (S810).

The piezoelectric device calculates the deviations of the acceleration information detected by the plurality of acceleration sensors 704. Further, the compensator 720 estimates the property deviations of the piezoelectric elements 702 based on the deviations of the acceleration information (S820).

After estimating the property deviations of the piezoelectric elements 702, the piezoelectric device controls the driving signals output through the driver 710 to compensate for the property deviations (S830).

In S820, when the property deviations of the piezoelectric elements 702 is estimated, the piezoelectric device calculates the compensation values for compensating for the property deviations. Further, the driving signals output through the driver 710 are compensated using the calculated compensation values, thereby compensating for property deviations of the piezoelectric elements 702.

In S830, if the number of piezoelectric elements 702 disposed on the panel 701 is equal to the number of acceleration sensors 704, the deviation of acceleration information detected by each acceleration sensor may correspond to the property deviation of the respective piezoelectric element 702.

In S830, if the number of acceleration sensors 704 disposed on the panel 701 is relatively smaller than the number of piezoelectric elements 702, the deviation in the acceleration information detected by each acceleration sensor 702 may correspond to the property deviations of the respective group of piezoelectric elements, each group including at least one piezoelectric element 702.

In S830, if the number of acceleration sensors 704 disposed on the panel 701 is relatively smaller than the number of piezoelectric elements 702, the acceleration information corresponding to each piezoelectric element 702 may be estimated by extrapolating/interpolating the acceleration information detected by each acceleration sensor 704. In this case, the property deviation of the respective piezoelectric element 702 may be estimated based on the deviation of the acceleration information estimated for each piezoelectric element 702.

As described above, the piezoelectric device according to still another exemplary embodiment of the present disclosure is integrated or coupled with the display panel of the display device, and as a result, may be operated as the haptic feedback device providing haptic feedback in the display device.

In particular, when the piezoelectric device is operated as the haptic feedback device in a large screen display device, the piezoelectric device may provide uniform haptic feedback irrespective of the position on the display panel, thereby improving the reliability of the haptic feedback device.

Although the foregoing exemplary embodiments of the present disclosure include a method for compensating for properties of the piezoelectric device using a temperature sensor and a method for compensating for properties of the piezoelectric device using an acceleration sensor, the present disclosure is not limited thereto. According to some exemplary embodiments of the present disclosure, the piezoelectric device may primarily compensate for a change in properties that depend on the temperature of the piezoelectric element by compensating for properties of the piezoelectric device using the temperature sensor according to the foregoing exemplary embodiments and compensate for the property deviation of the piezoelectric element by compensating for properties of the piezoelectric device using the acceleration sensor.

While this disclosure has been described in connection with exemplary embodiments, it is not limited to the disclosed embodiments, but, on the contrary, is intended to cover various modifications and equivalent arrangements included within the spirit and scope of the appended claims.

What is claimed is:
1. A display panel, comprising:
a panel; and
a piezoelectric device coupled with the panel,
wherein the piezoelectric device includes:
 a plurality of piezoelectric elements disposed at different positions of the panel and each configured to generate vibrations according to a driving signal;
 a driver configured to supply the driving signal to the plurality of piezoelectric elements;
 a plurality of acceleration sensors configured to detect acceleration information of the vibrations generated by the piezoelectric elements in different regions of the panel; and
 a compensator configured to control the driving signal to compensate for property deviations of the plurality of piezoelectric elements based on the acceleration information.

2. The display panel of claim 1, wherein: the compensator is configured to calculate the property deviations based on deviations in the acceleration information.

3. The display panel of claim 1, wherein:
the compensator is configured to divide the plurality of piezoelectric elements into a plurality of groups corresponding to the plurality of acceleration sensors one-to-one, depending on each position of the plurality of acceleration sensors, and
the property deviations for the plurality of groups are calculated based on deviations of the acceleration information detected by the plurality of acceleration sensors.

4. The display panel of claim 1, wherein the compensator is configured to:
estimate acceleration information corresponding to each piezoelectric element by extrapolating/interpolating the acceleration information detected by the plurality of acceleration sensors, and
calculate the property deviations based on a deviation of the acceleration information estimated for each piezoelectric element.

5. A display panel, comprising:
a panel;
a piezoelectric device coupled with the panel, wherein the piezoelectric device includes:
a plurality of piezoelectric elements disposed at different positions of the panel and each configured to generate vibrations according to a driving signal,
a driver configured to supply the driving signal to the plurality of piezoelectric elements,
a plurality of acceleration sensors configured to detect acceleration information of vibrations in different regions of the panel, and
a compensator configured to control the driving signal to compensate for property deviations of the plurality of piezoelectric elements based on the acceleration information;
a memory storing temperature property information that describes a relationship between a change in physical properties of a piezoelectric element and temperature; and
a temperature sensor disposed on the panel to detect temperature information, wherein the compensator is configured to control the driving signal based on the temperature information and the temperature property information.

6. The display panel of claim 5, wherein:
the temperature property information includes piezoelectric constants each corresponding to a temperature, and
the compensator is configured to read the piezoelectric constant corresponding to the temperature information from the memory and control the driving signal using a reference piezoelectric constant and the driving signal at a reference temperature and the piezoelectric constant corresponding to the temperature information.

7. The display panel of claim 1, wherein:
the compensator is configured to detect the acceleration information using the plurality of acceleration sensors while the same driving signal is supplied to the plurality of piezoelectric elements.

8. A method for compensating for properties of a piezoelectric device including a plurality of piezoelectric elements, the method comprising:
applying the same driving signal to drive the plurality of piezoelectric elements to generate vibrations;
detecting, by a plurality of acceleration sensors spaced apart from each other, acceleration information of the vibrations generated by the plurality of piezoelectric elements;
calculating property deviations of the plurality of piezoelectric elements based on the acceleration information; and
controlling driving signals output to the plurality of piezoelectric elements to compensate for the property deviations.

9. The method of claim 8, wherein:
the property deviation is calculated based on the deviation in the acceleration information.

10. The method of claim 8, wherein the calculating of the property deviation includes:
estimating acceleration information corresponding to each piezoelectric element by extrapolating/interpolating the acceleration information detected by the plurality of acceleration sensors, and
calculating the property deviations based on a deviation of the acceleration information estimated for each piezoelectric element.

* * * * *